United States Patent [19]
Tsuchiya

[11] Patent Number: 5,981,986
[45] Date of Patent: *Nov. 9, 1999

[54] SEMICONDUCTOR DEVICE HAVING A HETEROJUNCTION

[75] Inventor: Takuma Tsuchiya, Kawasaki, Japan

[73] Assignee: Fujitsu Limited, Kawasaki, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/059,289

[22] Filed: May 11, 1993

[30] Foreign Application Priority Data

May 11, 1992 [JP] Japan ................................ 4-117339

[51] Int. Cl.$^6$ .............................................. H01L 31/0328
[52] U.S. Cl. ......................... 257/200; 257/201; 257/12
[58] Field of Search .................................. 257/627, 255, 257/200, 12, 194, 183, 201, 22

[56] References Cited

U.S. PATENT DOCUMENTS

| | | | |
|---|---|---|---|
| Re. 33,584 | 5/1991 | Mimura | 257/194 |
| 4,792,832 | 12/1988 | Baba et al. | 257/194 |
| 5,300,793 | 4/1994 | Kondow et al. | 257/627 |

FOREIGN PATENT DOCUMENTS

| | | |
|---|---|---|
| 57-208174 | 12/1982 | Japan . |
| 61-280609 | 12/1986 | Japan . |
| 63-252484 | 10/1988 | Japan . |
| 2-257669 | 10/1990 | Japan . |
| 4246832 | 1/1991 | Japan . |

OTHER PUBLICATIONS

Brown et al., Defect Structure of Epi. CdTe Layers Grown on {100} and {111}β GaAs and on {111}β CdTe by MCVD, Apr. 1987, 1144–1145 Appl Phys 50(17).

Surface Science, "The Interface Transport Properties of Ge–GaAs Heterojunctions", L. Esaki et al., 1964, vol. 2, pp. 127–135.

*Primary Examiner*—Nathan K. Kelley
*Attorney, Agent, or Firm*—Staas & Halsey

[57] ABSTRACT

A semiconductor device comprises a first semiconductor layer formed of a Group III–V semiconductor layer or a II–VI semiconductor layer; and a second semiconductor layer formed of a Group IV semiconductor layer or a Group II–VI semiconductor layer which is different material from the first semiconductor layer and formed in heterojunction with the first semiconductor layer, a junction interface between the first semiconductor layer and the second semiconductor layer being {001} or {111} plane, and a two-dimensional carrier gas being generated in the heterojunction interface.

15 Claims, 6 Drawing Sheets

SEMICONDUCTOR DEVICE HAVING A HETEROJUNCTION

BACKGROUND OF THE INVENTION

The present invention relates to a semiconductor device, specifically to an FET (Field Effect Transistor), a BT (Bipolar Transistor), or a CCD (Charge Coupled Device) having a semiconductor heterojunction, which is for use in various electronic circuits, such as integrated circuits, and in the optical communication, and a method of fabricating the semiconductor device.

Higher speed and higher performance of these devices are recently required in accordance with higher speeds and larger capacities of computer systems and communication systems.

To speed up a operation of a semiconductor device, it is necessary to increase the carrier density and carrier mobility. Conventionally the carrier mobility has been enhanced by using compound semiconductors with high carrier mobilities, or by using a modulation-doped structure with a heterojunction to thereby reduce the impurity scattering.

But in a modulation-doped structure using a heterojunction, carrier density is determined by a band offset in the heterojunction interface. Even in the most studied GaAs/AlGaAs heterojunction, the carrier density is about $10^{12}$ cm$^{-2}$, which needs further improvement.

Even in this modulation-doped structure, the doped impurities near the heterojunction interface are random, and the carriers sense inhomogeneous potentials. Disadvantageously inhomogeneous potentials scatter the carriers, and the carrier mobility is accordingly deteriorated. The carrier scattering due to the random impurities is an unavoidable problem to the conventional GaAs/AlGaAs structure used in HEMTs (High Electron Mobility Transistors), in which carriers are not generated without higher dopant concentrations.

SUMMARY OF THE INVENTION

An object of the present invention is to provide a semiconductor device which has an improved carrier density and carrier mobility in the heterojunction interface, and a method of fabricating the semiconductor device, whereby to realize improved performance of various heterojunction devices.

The above-described object is achieved by a semiconductor device comprising a first semiconductor layer formed of a Group III–V semiconductor layer or a II–VI semiconductor layer; and a second semiconductor layer formed of a Group IV semiconductor layer or a Group II–VI semiconductor layer which is different material from the first semiconductor layer and formed in heterojunction with the first semiconductor layer, a junction interface between the first semiconductor layer and the second semiconductor layer being {001} or {111} plane, and a two-dimensional carrier gas being generated in the heterojunction interface.

In the above-described semiconductor device, the heterojunction is made by Group V element surface of the first semiconductor layer and Group IV element surface of the second semiconductor layer, or Group III element surface of the first semiconductor layer and Group VI element surface of the second semiconductor layer, or Group VI element surface of the first semiconductor layer and Group IV element surface of the second semiconductor layer; and a two-dimensional electron gas is generated in the heterojunction interface.

In the above-described semiconductor device, the heterojunction is made by Group III element surface of the first semiconductor layer and IV element surface of the second semiconductor layer, or Group V element surface of the first semiconductor layer and Group II element surface of the second semiconductor layer, or Group II element surface of the first semiconductor layer and Group IV element surface of the second semiconductor layer; and a two-dimensional hole gas is generated in the heterojunction interface.

In the above-described semiconductor device, the semiconductor device further comprises a source region; a drain region; a channel region sandwiched by the source and the drain regions including the first semiconductor layer and the second semiconductor layer; and a gate electrode formed above the channel region for controlling carriers flowing through the channel region, a two-dimensional carrier gas channel being formed in a heterojunction interface between the first semiconductor layer and the second semiconductor layer.

In the above-described semiconductor device, the first semiconductor layer and the second semiconductor layer forming the channel region are alternately laid one on another in a plurality of layers, and a plurality of a two-dimensional carrier gas channels are formed in a plurality of heterojunction interfaces between the first semiconductor layer and the second semiconductor layer.

In the above-described semiconductor device, the semiconductor device further comprises a first-conduction type collector layer including the first semiconductor layer; and a second-conduction type base layer including the second semiconductor layer formed on the collector layer; and a first conduction type emitter layer formed on the base layer, a current path for a base current to flow being formed in a heterojunction interface between the collector layer formed of the first semiconductor layer and the base layer formed of the second semiconductor layer.

In the above-described semiconductor device, the semiconductor device further comprises a first-conduction type collector layer; a second-conduction type base layer including the second semiconductor layer formed on the collector layer; and a first conduction type emitter layer including the first semiconductor layer formed on the base layer, a current path for a base current to flow being formed in a heterojunction interface between the emitter layer formed of the first semiconductor layer and the base layer formed of the second semiconductor layer.

In the above-described semiconductor device, the semiconductor device further comprises a first-conduction type collector layer; a second-conduction type base layer including the first semiconductor layer and the second semiconductor layer formed on the collector layer; and a first conduction type emitter layer formed on the base layer formed on the base layer, a current path for a base current to flow being formed in a heterojunction interface between the first semiconductor layer and the second semiconductor layer.

In the above-described semiconductor device, the semiconductor device further comprises a first-conduction type collector layer; a collector barrier layer including the first semiconductor layer formed on the collector layer; a second-conduction type base layer including the second semiconductor layer formed on the collector barrier layer; and a first-conduction type emitter layer formed on the base layer, a bandgap of the collector barrier layer being wider than that of the base layer, a current path for a base current to flow being formed in a heterojunction interface between the collector barrier layer formed of the first semiconductor layer and the base layer formed of the second semiconductor layer.

In the above-described semiconductor device, the semiconductor device further comprises a first-conduction type collector layer; a second-conduction type base layer including the second semiconductor layer; an emitter barrier layer including the first semiconductor layer formed on the base layer; and a first-conduction type emitter layer formed on the emitter barrier layer, a bandgap of the emitter barrier layer being wider than that of the base layer, a current path for a base current to flow being formed in a heterojunction interface between the emitter barrier layer formed of the first semiconductor layer and the base layer formed of the second semiconductor layer.

In the above-described semiconductor device, the semiconductor device further comprises a first-conduction type collector layer; a second-conduction type base layer including the second semiconductor layer; a resonance tunnel barrier layer including a first to a third layers formed on the base layer one on another, the first t layer including the first semiconductor layer, the second layer being sandwiched by the first and the third layers whose bandgap is wider than that of the second layer; and a first-conduction type emitter layer, the bandgap of the first layer of the resonance tunnel barrier layer in contact with the base layer being wider than that of the base layer, a current path for a base current to flow being formed in a heterojunction interface between the first layer of the resonance tunnel barrier layer formed of the first semiconductor layer and the base layer formed of the second semiconductor layer.

In the above-described semiconductor device, the semiconductor device further comprises a channel layer including the first semiconductor layer and the second semiconductor layer; and a plurality of gate electrodes formed above the channel layer for sequentially transferring carriers stored in the channel layer, pulse voltages applied to the gate electrodes transferring a two-dimensional carrier gas generated in heterojunction interface between the first semiconductor layer and the second semiconductor layer.

In the above-described semiconductor device, the first semiconductor layer is a GaAs layer or an AlGaInAs layer, and the second semiconductor layer is a Ge layer.

In the a bove-described semiconductor device, concentrations of p-type or n-type impurities contained in the first semiconductor layer and in the second semiconductor layer are below $5\times10^{15}$ cm$^{-3}$ respectively.

The above-described object is achieved by a method of fabricating a semiconductor device comprising a heterojunction between a first semiconductor layer which consists of Group III–V semiconductor or Group II–VI semiconductor material, and a second semiconductor layer which consists of Group IV semiconductor or Group II–VI semiconductor material formed on a substrate, the method comprising a first step of feeding a material gas of the first semiconductor layer for forming the first semiconductor layer on the substrate, a second step of feeding a hydrogen gas for covering a surface of the first semiconductor layer with a hydrogen atom layer, and a third step of feeding a material gas of the second semiconductor layer to the first semiconductor layer covered with the hydrogen atom layer for growing the second semiconductor layer on the surface of the first semiconductor layer by the segregation of the hydrogen atoms.

In the above-described method of fabricating a semiconductor device, a Group III–V semiconductor layer or a Group II–VI semiconductor layer is formed by feeding one element material gas and the other element material gas alternately.

In heterojunctions between a Group III–V semiconductor layer and a Group IV semiconductor layer, a Group III–V semiconductor layer and a Group II–VI semiconductor layer, a heterojunction between a Group II–VI semiconductor layer and a Group IV semiconductor layer, and other heterojunctions, it is known from band calculation that growth in [001] or [111] direction generates in bandgaps of both semiconductor layers an interface level which is to be locally present in the (001) or (111) plane heterojunction interface.

This level is one kind of impurity level, and it is understood from the following qualitative study that this level generates a wave function only in the heterojunction interface. In this study, a Group III–V semiconductor layer is a GaAs layer, and a Group IV semiconductor layer is a Ge layer, and a heterojunction between these GaAs layer and Ge layer will be used.

The heterojunctions in (001) or (111) plane between the GaAs layer and the Ge layer are the Ga layer and the Ge layer junction with each other, and the As layer and the Ge layer junction with each other.

In the case that the As layer and the Ge layer junction with each other, the As's in the interface can be a donor with one more charge electron as viewed from the Ge layer. As viewed from the GaAs layer, the Ga's are replaced by the Ge's, and the Ge's can be a donor with one more charge electron. Thus, as viewed from both of the GaAs layer and the Ge layer, donor levels are present in the heterojunction interface.

On the other hand, in the heterojunction between the Ga layer and the Ge layer, oppositely from the above-described case, it can be considered that an acceptor level is present in the heterojunction interface.

In both cases, these interface levels supply a two-dimensional carrier gas. It is known from the band calculation that these levels generate a wave function near the heterojunction interface, have large dispersion parallelly with the heterojunction interface, and can carry currents.

Densities of these interface levels are $2a^{-2}$ when a lattice constant is represented by a. For example, in the case of the GaAs/Ge heterojunction, its density is $6\times10^{14}$ cm$^{-2}$ which is higher by two orders than a carrier density of the in the conventional GaAs/AlGaAs heterojunction.

In the heterojunction interface, a potential is perfectly periodic. Accordingly, it does not happen that scattering of carriers due to random potentials caused by doped impurities deteriorates a carrier mobility as does in the usual impurities doping. A high carrier mobility can be obtained.

In the above-described explanation, a combination of a GaAs layer and a Ge layer were used as a combination of a Group III–V semiconductor layer and a Group IV semiconductor layer which form a heterojunction, but in addition, a combination of a GaP layer and an Si layer may be used. As a combination of a Group III–V semiconductor layer and a Group II–VI semiconductor layer is exemplified by a combination of a GaAs layer and a ZnSe layer. A combination of a Group II–VI semiconductor layer and a Group IV semiconductor layer is exemplified by a combination of a ZnSe layer and a Ge layer.

Thus, according to this invention, an interface of a heterojunction between a first semiconductor layer of a Group III–V semiconductor layer or a Group II–VI semiconductor layer and a second semiconductor layer of a Group IV semiconductor layer or a II–VI semiconductor layer is {001} or {111} plane, control is made so that element layers of the first and the second semiconductor layers to be exposed on the junction interface constitute a set combination, whereby a two-dimensional electron gas or a two-dimensional hole gas of high mobility can be generated in high density in the junction interface.

The thus generated high density and high mobility two-dimensional electron gas or two-dimensional hole gas is used as carrier for semiconductor devices, such as FETs, BTs, CCDs, etc., whereby performance of various semiconductor devices with heterojunction can be much improved.

DETAILED DESCRIPTION OF THE INVENTION

Figure 1:
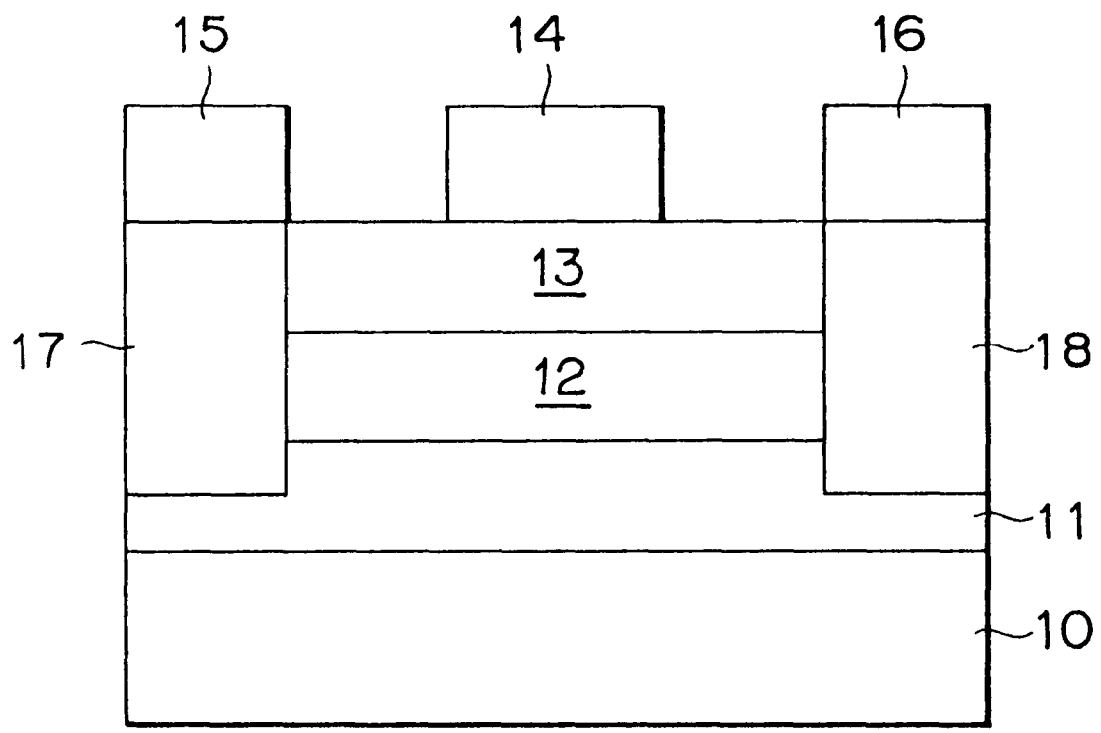
FIG. 1 is a sectional view of a HEMT-type heterojunction FET according to a first embodiment of this invention.

This invention will be explained by means of embodiments illustrated in the drawings.

FIG. 1 is a sectional view of a HEMT-type heterojunction FET according to a first embodiment of this invention.

On an undoped Ge substrate 10 there are formed an undoped Ge layer 11, an undoped GaAs layer 12, and an undoped AlGaAs layer 13 in the stated order. A gate electrode 14 is formed on the Al GaAs layer 13 in Schottky contact.

A source electrode 15 and a drain electrode 16 are formed with the gate electrode 14 therebetween. The source electrode 15 and the drain electrode 16 are in ohmic contact with n+-heavily doped regions 17, 18 which reach the junction interfaces between the Ge layer 11 and the GaAs layer 12.

This first embodiment is characterized in that the heterojunction interface between the Ge layer 11 and the GaAs layer 12 is {001} or {111} plane, and an As layer is exposed on the junction interface of the GaAs layer 12. This heterojunction interface is an As/Ge interface and has a donor level of about $6 \times 10^{14}$ cm$^{-2}$. A two-dimensional electron gas is supplied, and a two-dimensional electron channel is provided.

Next, a method of forming the heterojunction between the Ge layer 11 and the GaAs layer 12 will be explained.

MBE (Molecular Beam Epitaxy) technique is used. The undoped Ge substrate 10 is heated up to about 600° C. to remove the natural oxide film formed on the surface thereof. Then the temperature of the substrate is lowered down to about 200° C., and then the shutter of a Ge molecular beam source cell is opened to grow the undoped Ge layer 11 on the Ge substrate 10.

Subsequently after the shutter of the Ge molecular beam source cell is closed, hydrogen radicals generated by plasmatizing hydrogen gas are irradiated to the Ge layer 11, and a hydrogen atom layer is formed on the Ge layer 11. At this time, the hydrogen atoms are adsorbed preferentially to the surface of the Ge layer 11, and many of the hydrogen atoms are not adsorbed to a surface of the adsorbed hydrogen atoms. A single hydrogen atom layer can be formed on the Ge layer 11.

Subsequently the shutter of an As molecular beam source cell is opened to feed As atoms. The As atoms submerge below the hydrogen atom layer, and epitaxially grow an As layer on the Ge layer 11. This is due to that hydrogen atoms, which are very segregative, segregate up to the surface, and the As atoms are displaced onto the Ge layer 11 which has been below the hydrogen atom layer. The hydrogen atom layer on the As layer hinders the migration of the As layer on the Ge layer 11, and the segregation between the Ge layer 11 and the As layer can be prevented.

Then the shutter of the Ga molecular beam source cell is opened to feed Ga atoms. As in the feed of the As atoms, the hydrogen atom layer functions as the filter also in epitaxially growing a Ga layer on the As layer. The growth of an As layer and a Ge layer is repeated, and the undoped GaAs layer 12 is formed on the Ge layer 11.

Thus, the segregation between the Ge layer 11 and the GaAs layer 12 is prevented, and a sharp heterojunction at the interface of which the atoms of the respective layers 11, 12 are not mixed with each other can be formed. Concentrations of impurities unintentionally contained in the Ge layer 11 and the GaAs layer 12 are retained low. For example, the concentrations of p-type or n-type impurities are below $5 \times 10^{15}$ cm$^{-3}$.

Thus, according to the first embodiment, a high density of a two-dimensional electrons can be supplied to the As/Ge interface without doping impurities near the heterojunction interface between the Ge layer 11 and the GaAs layer 12, so that the electron mobility is not lowered by electron scattering due to random potentials resulting from doping impurities. Accordingly a two-dimensional electron channel of a higher density and high mobility can be formed, and a HEMT-type n-FET of high speed and high performance can be realized.

In the first embodiment, the junction interface of the heterojunction between the Ge layer 11 and the GaAs layer 12 is an As/Ge interface where the As layer is exposed has been explained. But the Ga layer may be exposed in the interface with the GaAs layer 12.

In this case, the heterojunction interface is a Ga/Ge interface. A Two-dimensional hole gas is supplied, and a two-dimensional hole channel is formed. Accordingly the n+-heavily doped regions 17, 18 are formed p-type, and a HHMT (High Hole Mobility Transistor)-type p-FET can be realized.

In a method of forming the Ge layer 11 and the GaAs layer 12 in this case, the undoped Ge layer 11 is formed on the Ge substrate 10, and then after the hydrogen atom layer is formed on the Ge layer 11, the shutter of the Ga molecular beam source cell is opened to supply Ga atoms to epitaxially grow the Ga layer on the Ge layer 11. Subsequently the As layer is epitaxially grown on the Ga layer.

The As layer and the Ga layer can be selectively exposed on the heterojunction interface between the Ge layer 11 and the GaAs layer 12 by growing the GaAs layer 12 by ALE (Atomic Layer Epitaxy) technique.

In the first embodiment, one channel is formed in the heterojunction interface between the Ge layer 11 and the GaAs layer 12. But a plurality of channels may be formed by inserting a Ge layer and a GaAs layer between the GaAs layer 12 and the AlGaAs layer 13, which makes it possible to increase a current flowing through the entire channel region.

In the first embodiment, no impurity is doped near the heterojunction interface between the Ge layer 11 and the GaAs layer 12, but it is possible to dope a required impurity for purposes of adjusting a threshold values, etc. In this case, in place of a little sacrificing the improvement of speed, other characteristics, such as low threshold values, etc., can be improved.

The first embodiment has been explained by means of a HEMT-type FET. But the first embodiment is not limited to FETs of that type but may be MESFET (Metal Semiconductor FET)-type FETs.

Figure 2:
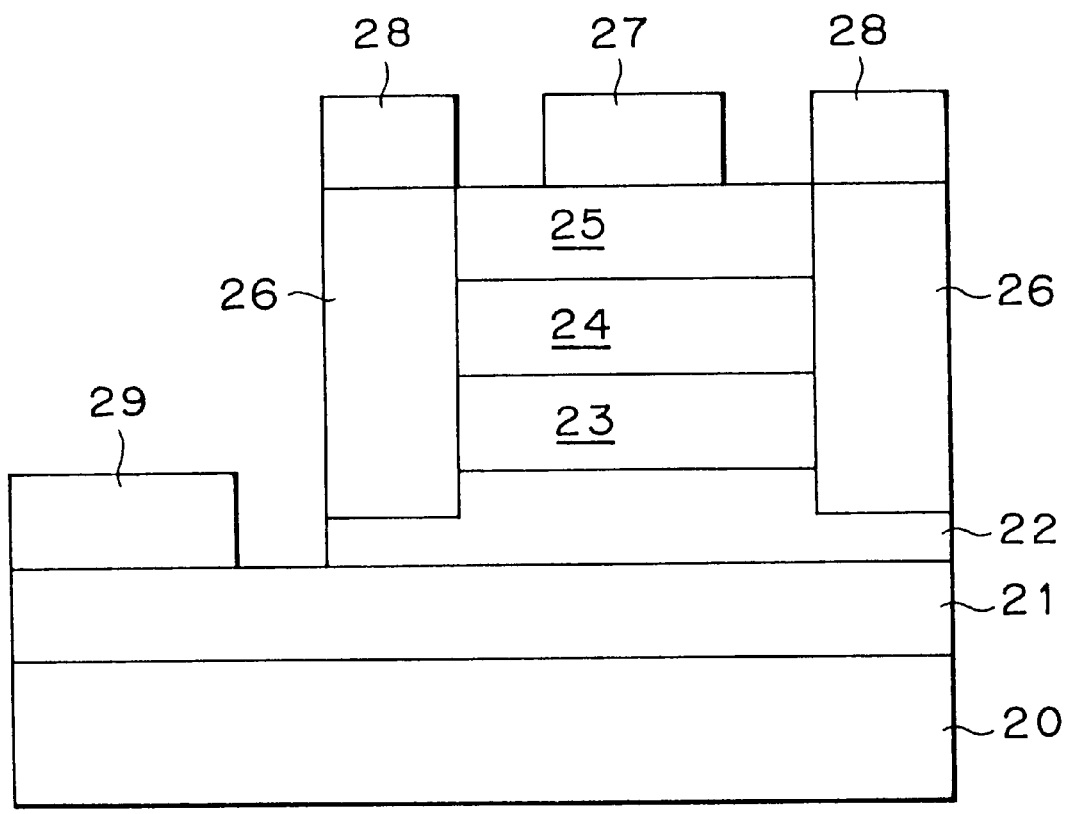
FIG. 2 is a sectional view of an npn-HBT according to a second embodiment of this invention.

Next, an npn-HBT (Heterojunction BT) according to a second embodiment of this invention will be explained with reference to the sectional view of FIG. 2.

On a GaAs layer 20, there are formed an $n^+$-GaAs collector contact layer 21, an n-GaAs collector layer 22, a p-Ge base layer 23, an n-GaAs emitter layer 24, and an $n^+$-GaAs emitter contact layer 25 in the stated order. $P^+$-heavily doped regions 26 is formed down to the junction interface between the n-GaAs collector layer 22 and the p-Ge base layer 23.

An emitter electrode 27, a base electrode 28 and a collector electrode 29 are formed respectively on the $n^+$-GaAs emitter contact layer 25, the $p^+$-heavily doped region 26 and the $n^+$-GaAs collector layer 21 respectively in ohmic contact with each other.

This second embodiment is characterized in that the heterojunction interface between the n-GaAs collector layer 22 and the p-Ge base layer 23, and the heterojunction interface between the p-Ge base layer 23 and the n-GaAs emitter layer 24 are {001} or {111} planes, and Ga layer are exposed on the heterojunction interfaces of the n-GaAs collector layer 22 and of the n-GaAs emitter layer 24 respectively. Accordingly these two heterojunction interfaces are Ga/Ge interfaces and have acceptor levels of about $6 \times 10^{14}$ cm$^{-2}$. Current paths through which currents easily flow are provided.

Next, a method of forming the heterojunction between the n-GaAs collector layer 22 and the p-Ge base layer 23 will be explained.

The n-GaAs collector layer 22 is grown on the $n^+$-GaAs collector contact layer 21 by MBE technique. Immediately following the growth of the n-GaAs collector layer 22, hydrogen radicals are irradiated to form a hydrogen atom layer. After a final Ga layer is grown with the shutter of an As molecular beam source cell closed, the shutter of the Ga molecular beam source cell is closed. Thus, when the n-GaAs collector layer 22 has been grown, the surface of the Ga layer as a surface layer of the n-GaAs collector layer 22 is covered with the hydrogen atom layer. The irradiation of the hydrogen radicals is started before the growth of the final As layer of the n-GaAs collector layer 22 so as to preclude the randomness of the interface caused by re-vaporization of the As after the end of the growth due to a relatively high As vapor pressure.

Subsequently the shutter of the Ge molecular beam source cell is opened to feed Ge atoms, with the hydrogen atom layer as the filter, a Ge layer is epitaxially grown on the Ga layer of the n-GaAs collector layer 22, and the p-Ge base layer 23 is formed. Thus, the segregation between the n-GaAs collector layer 22 and the p-Ge base layer 23 is prevented. A sharp heterojunction at the interface of which their elements are not mixed with each other can be formed.

The heterojunction between the p-Ge base layer 23 and the n-GaAs emitter layer 24 is formed by the same process as that between the Ge layer 11 and the GaAs layer 12 in the first embodiment.

Thus, according to the second embodiment, high-density acceptor levels are formed in the Ga/Ge interfaces in the heterojunction interfaces between the n-GaAs collector layer 22 and the p-Ge base layer 23, and between the p-Ge base layer 23 and the n-GaAs emitter layer 24. Current paths of low resistance for base current are provided, and an npn-HBT of low base resistance can be realized.

In the second embodiment, two current paths are provided by the two heterojunction interfaces between the n-GaAs collector layer 22 and the p-Ge base layer 23, and between the p-Ge base layer 23 and the n-GaAs emitter layer 24, but one base current path may be provided.

For example, it is possible that an n-Ge collector layer, a p-Ge base layer and an n-GaAs emitter layer are laid one on another, and a base current path is formed in the heterojunction interface between the p-Ge base layer and the n-GaAs emitter layer. It is also possible that an n-Ge collector layer, a p-GaAs base layer, and an n-GaAs emitter layers are laid one on another, and a base current path is formed in the heterojunction interface between the n-Ge collector layer and the p-GaAs base layer. It is possible that an n-Ge collector layer, a p-Ge base layer and a p-GaAs base layer and an n-GaAs emitter layers are laid one on another, and a base current path is formed in the heterojunction interface between the p-Ge base layer and the n-GaAs base layer. Other variations are also possible.

Furthermore, a heterojunction interface of a emitter layer and a base layer, a heterojunction interface of the base layer and a collector layer, and a heterojunction interface in the base layer are combined, or a Ge layer and a GaAs layer are repeatedly laid one on another in the base layer to form a plurality of heterojunction interfaces, whereby three or more base current paths can be provided.

The second embodiment has been explained by means of an npn-HBT, but this invention is applicable to a pnp-HBT. In the case of a pnp-HBT, the conduction types of the emitter layer, the base layer, the collector layer, etc. in FIG. 2 are made opposite, and at the same time, As layers are exposed in the heterojunction interfaces between the Ge layer and the GaAs layers constituting base current paths. Thus, the heterojunction interfaces are As/Ge interfaces, and high-density donor levels are formed therein. As in the second embodiment, current paths of low resistance for base current are provided, and the pnp-HBT of a low base resistance can be realized.

In this case, in forming the heterojunction between a p-GaAs collector layer and a p-Ge base layer, immediately before the end of the growth of the p-GaAs collector layer, the shutter of a Ga molecular beam source cell is closed, concurrently the irradiation of hydrogen radicals is started to form a hydrogen atom layer. Then the shutter of an As molecular beam source cell is closed. Then with the irradiation of the hydrogen radicals set on, the shutter of the Ge molecular beam source cell is opened to feed Ge atoms. Then the irradiation of the hydrogen atoms is stopped. In this manner, the n-Ge base layer is grown on the As layer of the p-GaAs collector layer.

Figure 3:
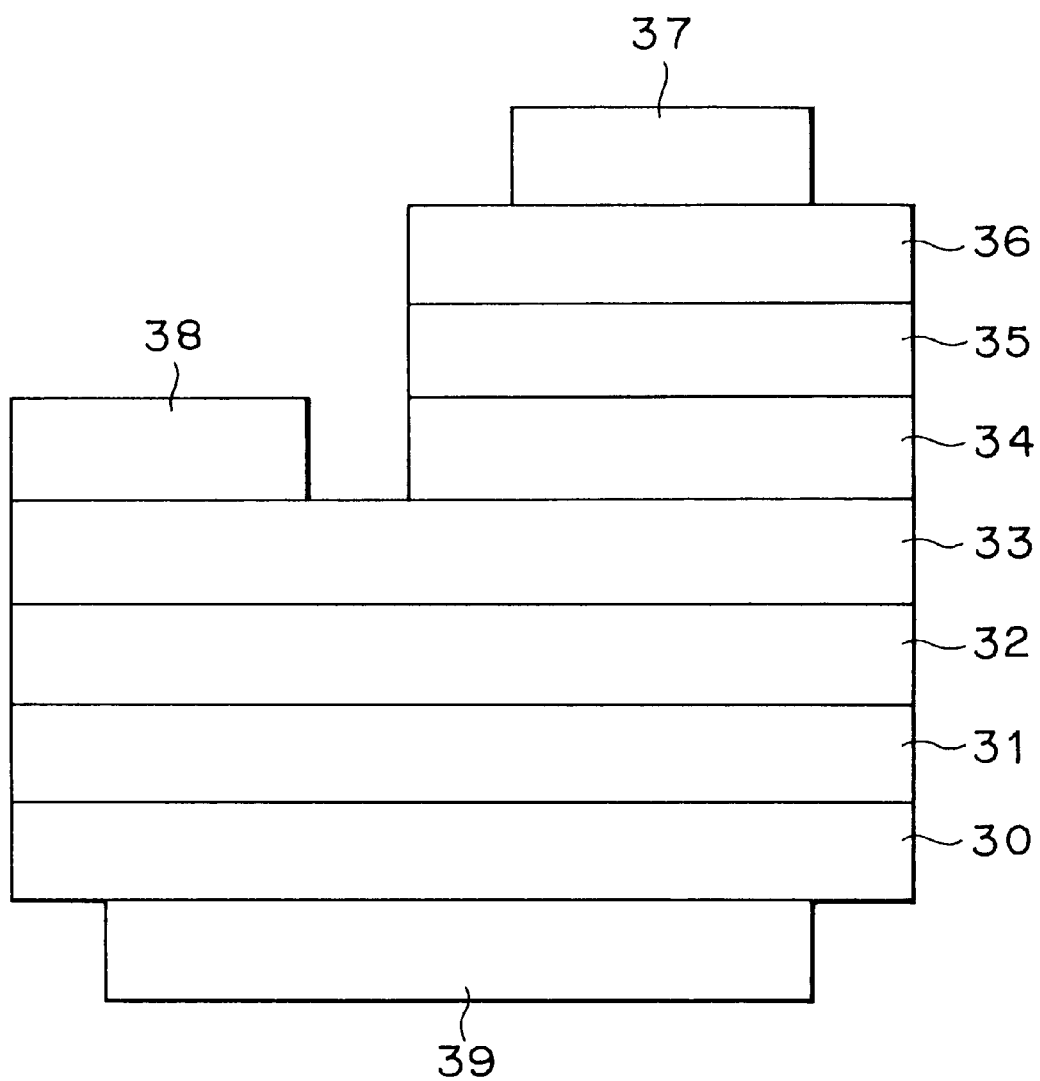
FIG. 3 is a sectional view of a HET according to a third embodiment of this invention.

Next, a HET (Hot Electron Transistor) according to a third embodiment of this invention will be explained with reference to the sectional view of FIG. 3.

On an $n^+$-GaAs collector contact layer 30, there are formed an n-GaAs collector layer 31, an AlGaAs collector barrier layer 32, an n-Ge base layer 33, an AlGaAs emitter barrier layer 34, an n-GaAs emitter layer 35 and an $n^+$-GaAs emitter contact layer 36 one on another.

An emitter electrode 37, a base electrode 38 and a collector electrode 39 are formed respectively on the $n^+$-GaAs emitter contact layer 36, the n-Ge base layer 33, and on the underside of the n$^+$-GaAs collector contact layer 30 respectively in ohmic contact.

The third embodiment is characterized in that the heterojunction interface between the AlGaAs collector barrier layer 32 and the n-Ge base layer 33, and the heterojunction interface between the n-Ge base layer 33 and the AlGaAs emitter barrier layer 34 are {001} or {111} planes, and As layers are exposed on the junction interfaces of the AlGaAs collector barrier layer 32 and of the AlGaAs emitter barrier layer 34 respectively. Accordingly these two heterojunction interfaces are As/Ge interfaces and have donor levels of about 6×10$^{14}$ cm$^{-2}$, and current paths through which currents easily flow are provided.

Thus, according to the third embodiment, high density donor levels are formed in the As/Ge interfaces in the heterojunction interfaces between the AlGaAs collector barrier layer 32 and the n-Ge base layer 33, and between the n-Ge base layer 33 and the AlGaAs emitter barrier layer 34, and low-resistance current paths for base current are provided. A HET of low base resistance can be realized.

Figure 4:
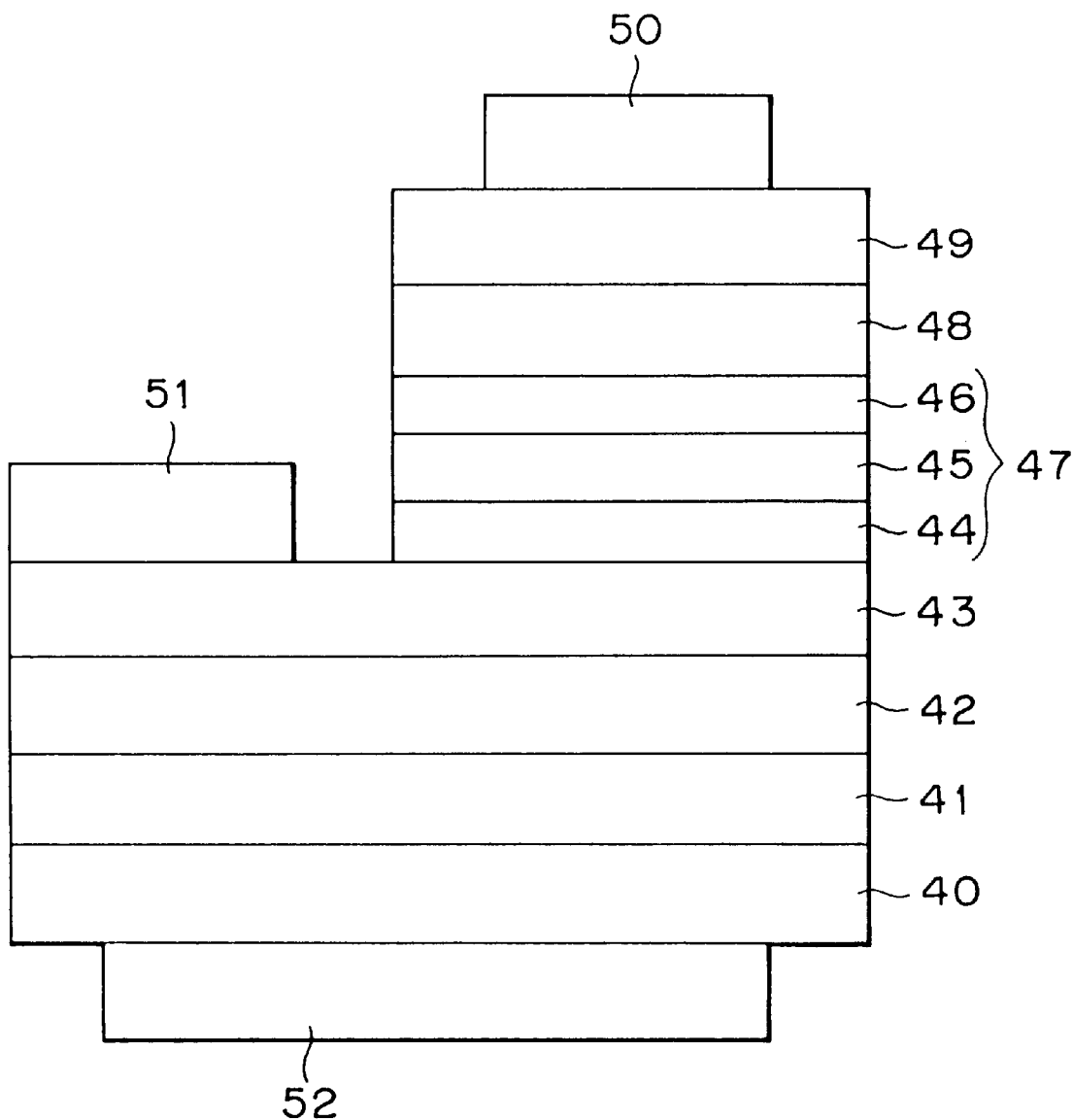
FIG. 4 is a sectional view of a RHET according to a fourth embodiment of this invention.

Next, an RHET (Resonant-tunneling HET) according to a fourth embodiment of this invention will be explained with reference to the sectional view of FIG. 4.

On an n$^+$-GaAs collector contact layer 40, there are formed an n-GaAs collector layer 41, an AlGaAs collector barrier layer 42, an n-Ge base layer 43 an AlGaAs layer 44, a GaAs layer 45 and an AlGaAs layer 46 one on another. The AlGaAs layer 44, the GaAs layer 45 and the AlGaAs layer 46 constitute a resonance tunnel barrier layer 47 in which the intermediate thin GaAs layer 45 sandwiched by the lower AlGaAs layer 44 and the upper AlGaAs layer 46, which have wide bandgaps.

On the resonance tunnel barrier layer 47, there are formed an n-GaAs emitter layer 48 and an n$^+$-GaAs emitter contact layer 49 in the stated order. An emitter electrode 50, a base electrode 51 and a collector electrode 52 are formed respectively on the n$^+$-GaAs emitter contact layer 49, the n-Ge base layer 43 and the underside of the n$^+$-GaAs collector contact layer 40 respectively in ohmic contact.

The fourth embodiment is characterized in that the heterojunction interface between the AlGaAs collector barrier layer 42 and the n-Ge base layer 43, and the heterojunction interface between the n-base layer 43 and the AlGaAs layer 44 of the resonance tunnel barrier layer 47 are {001} or {111} planes, and As layers are exposed on the junction interfaces of the AlGaAs collector barrier layer 42 and of the AlGaAs layer 44.

According to the fourth embodiment as well as the third embodiment, high-density donor levels are formed in the As/Ge interfaces in the heterojunction interfaces between the AlGaAs collector barrier layer 42 and the n-Ge base layer 43, and between the n-Ge base layer 43 and the resonance tunnel barrier layer 47, and low-resistance current paths for base current are formed. An RHET of low base resistance can be realized.

Figure 5:
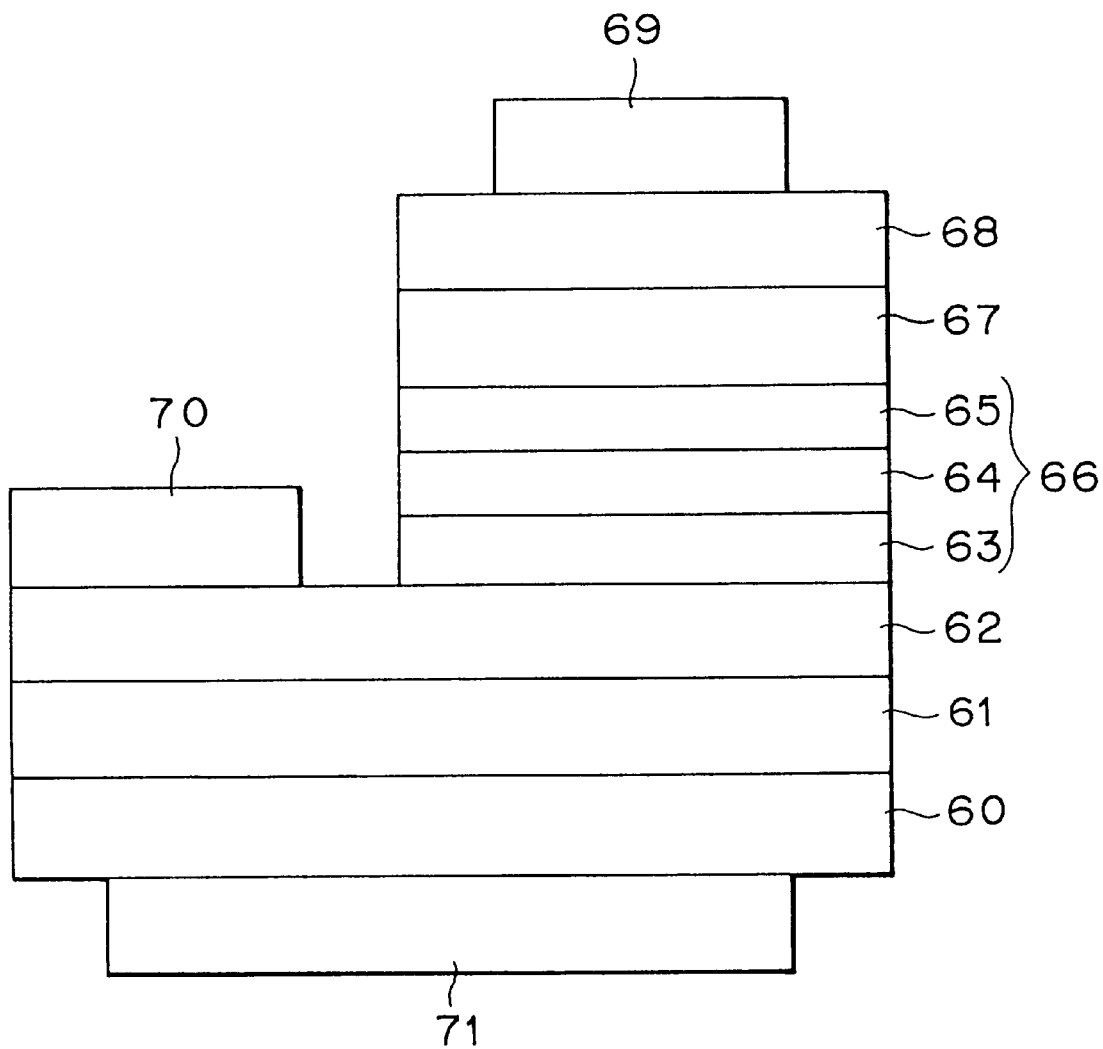
FIG. 5 is a sectional view of an npn-RBT according to a fifth embodiment of this invention.

Next, an npn-RBT(Resonant-tunneling BT) according to a fifth embodiment of this invention will be explained with reference to the sectional view of FIG. 5.

On an n$^+$-GaAs collector contact layer 60, there are formed an n-GaAs collector layer 61 and a p-Ge base layer 62 one on another. On the p-Ge base layer 62, there are formed an AlGaAs layer 63, a GaAs layer 64 and an AlGaAs layer 65, which constitute a resonance barrier layer 66. An n-GaAs emitter layer 67 and an n$^+$-GaAs emitter contact layer 68 are laid one on another on the resonance tunnel barrier layer 66.

An emitter electrode 69, a base electrode 70 and a collector electrode 71 are formed respectively on the n$^+$-GaAs emitter contact layer 68, the p-Ge base layer 62 and the underside of the n$^+$-GaAs collector contact layer 60 respectively in ohmic contact.

The fifth embodiment is characterized in that the heterojunction interfaces between the n-GaAs collector layer 61 and the p-Ge base layer 62 and between the p-Ge base layer 62 and the AlGaAs layer 63 of the resonance tunnel barrier layer 66 are {001} or {111} planes, and a Ga layer is exposed on the junction interface of the n-GaAs collector layer 61, and an AlGa layer is exposed on the junction interface of the AlGaAs layer 63.

Thus, accordingly to the fifth embodiment as well as the second embodiment, high-density acceptor levels are formed in the Ga/Ge interface of the junction interface between the n-GaAs collector layer 61 and the p-Ge base layer 62, and in the AlGa/Ge interface of the heterojunction interface between the p-Ge base layer 62 and the resonance tunnel barrier layer 66, and these interfaces are current paths of low resistance for base currents. An npn-RBT of low base resistance can be realized.

Figure 6:
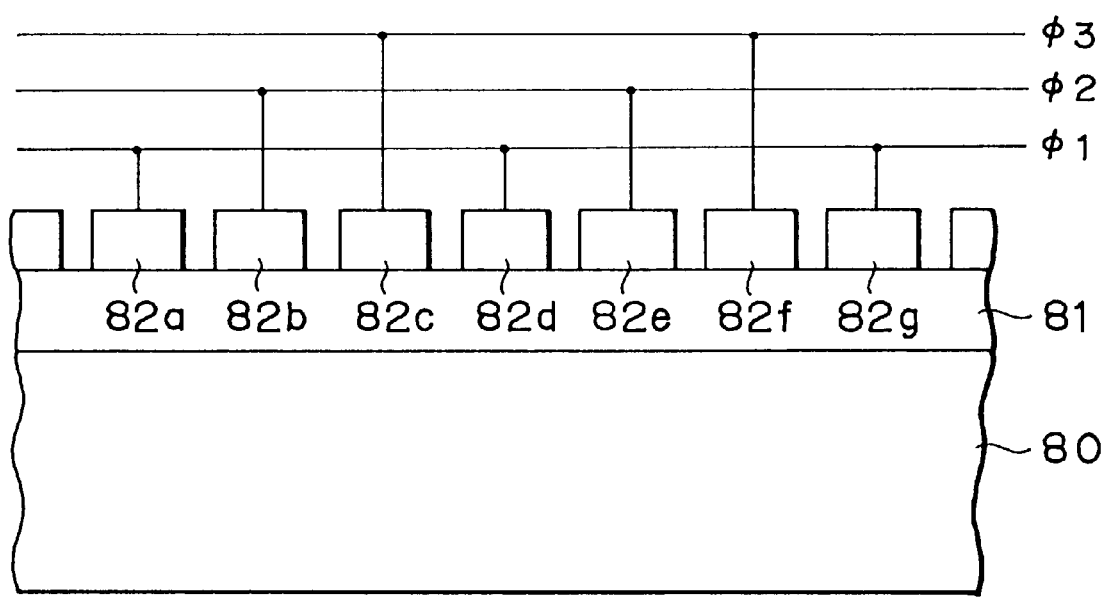
FIG. 6 is a sectional view of CCD according to a sixth embodiment of this invention.

Next, a CCD according to a sixth embodiment of this invention will be explained with reference to the sectional view of FIG. 6.

On a Ge substrate 80, there is formed an AlGaAs layer 81. And a plurality of gate electrodes 82a, 82b, 82c, . . . are arranged on the AlGaAs layer 81. The gate electrodes 82a, 82b, 82c, . . . are wired so as to be supplied with pulse voltages Φ1, Φ2, Φ3 which are periodically change.

The sixth embodiment is characterized in that the heterojunction interface between the Ge substrate 80 and the AlGaAs layer 81 are {001} or {111} planes, and an As layer is exposed on the junction interface of the AlGaAs layer 81. The heterojunction interface has an As/Ge interface. A donor level is formed therein, and a two-dimensional electron gas is generated. The two-dimensional electron gas is transferred as signal charge in the heterojunction interface between the Ge substrate and the AlGaAs layer 81 by controlling the pulse voltages Φ1, Φ2, Φ3 applied to the gate electrodes 82a, 82b, 82c, . . . .

Thus, according to the sixth embodiment, a two-dimensional electron gas is generated in a high density in the As/Ge interface of the heterojunction interface between the Ge substrate 80 and the AlGaAs layer 81, and transferred as signal charges. A CCD of high speed and high performance can be realized.

In the sixth embodiment, the case in which the heterojunction interface on the AlGaAs layer 81 is an As/Ge interface where an As layer is exposed has been described, but an AlGa layer may be exposed on the junction interface of the AlGaAs layer 81.

In these cases, the heterojunction interface is an AlGa/Ge interface, and a two-dimensional hole gas is formed to be transferred as signal charges. Resultantly the same effect can be produced.

What is claimed is:

1. A semiconductor device comprising:
   a first semiconductor layer formed of one selected from the group consisting of a Group III–V semiconductor layer and a Group II–VI semiconductor layer; and
   a second semiconductor layer formed of one selected from the group consisting of a Group IV semiconductor layer and a Group II–VI semiconductor layer which is a different material from said first semiconductor layer and formed in heterojunction with said first semiconductor layer, a heterojunction interface between said first semiconductor layer and said second semiconductor layer being one selected from the group consisting of {001} plane and {111} plane, and a two-dimensional carrier gas being created by a surplus or a lack of electrons, which is generated by crystal bonding between elements of said first semiconductor layer and elements of said second semiconductor layer in said heterojunction interface, said two-dimensional carrier gas generated in the heterojunction interface being a channel for a current to flow, the second semiconductor layer substantially lattice-matching the first semiconductor layer, and the first semiconductor layer and the second semiconductor layer being non-doped.

2. A semiconductor device according to claim 1, wherein:

said first semiconductor layer is formed of a Group III–V semiconductor layer, said second semiconductor layer is formed of a Group IV semiconductor layer, said heterojunction interface is made by Group V element surface of said first semiconductor layer and Group IV element surface of said second semiconductor layer, and said two-dimensional carrier gas is generated by electrons which are created by a surplus of electrons, which is generated by crystal bonding between Group V elements with a valence of 5 of said Group V element surface and Group IV elements with a valence of 4 of said Group IV element surface in said heterojunction interface.

3. A semiconductor device according to claim 1, wherein:

said first semiconductor layer is formed of a Group III–V semiconductor layer, said second semiconductor layer is formed of a Group IV semiconductor layer, said heterojunction interface is made by Group III element surface of said first semiconductor layer and Group IV element surface of said second semiconductor layer, and said two-dimensional carrier gas is generated by holes which are created by a lack of electrons, which is generated by crystal bonding between Group III elements with a valence of 3 of said Group III element surface and Group IV elements with a valence of 4 of said Group IV elements surface in said heterojunction interface.

4. A semiconductor device according to claim 1, further comprising a source region; a drain region; a channel region, sandwiched by the source and the drain regions, including said first semiconductor layer and said second semiconductor layer; and a gate electrode formed above said channel region for controlling carriers flowing through said channel region, a two-dimensional carrier gas channel being formed by said two-dimensional carrier gas which is present in said heterojunction interface between said first semiconductor layer and said second semiconductor layer.

5. A semiconductor device according to claim 4, wherein said first semiconductor layer and said second semiconductor layer forming said channel region are alternately laid one on another in a plurality of layers, and a plurality of two-dimensional carrier gas channels are formed by said two-dimensional carrier gas which is present in a heterojunction interface between said first semiconductor layer and said second semiconductor layer.

6. A semiconductor device according to claim 1, wherein said first semiconductor layer is one selected from the group consisting of a GaAs layer and an AlGaInAs layer, and said second semiconductor layer is a Ge layer.

7. A semiconductor device according to claim 3, wherein concentrations of said two-dimensional hole gas are about $6 \times 10^{14}$ cm$^{-2}$; and concentrations of p-type impurities contained in said first semiconductor layer and in said second semiconductor layer are below $5 \times 10^{15}$ cm$^{-3}$, respectively.

8. A semiconductor device according to claim 1, wherein:

said first semiconductor layer is formed of a Group III–V semiconductor layer, said second semiconductor layer is formed of a Group II–VI semiconductor layer, said heterojunction interface is made by Group III element surface of said first semiconductor layer and Group VI element surface of said second semiconductor layer, and said two-dimensional carrier gas is generated by electrons which are created by a surplus of electrons, which is generated by crystal bonding between Group III elements with a valence of 3 of said Group III element surface and Group VI elements with a valence of 6 of Group VI element surface in said heterojunction interface.

9. A semiconductor device according to claim 1, wherein:

said first semiconductor layer is formed of a Group II–VI semiconductor layer, said second semiconductor layer is formed of a Group IV semiconductor layer, said heterojunction interface is made by Group VI element surface of said first semiconductor layer and Group IV element surface of said second semiconductor layer, and said two-dimensional carrier gas is generated by electrons which are created by a surplus of electrons, which is generated by crystal bonding between Group VI elements with a valence of 6 of said Group VI element surface and Group IV elements with a valence of 4 of said Group IV element surface in said heterojunction interface.

10. A semiconductor device according to claim 1, wherein:

said first semiconductor layer is formed of a Group III–V semiconductor layer, said second semiconductor layer is formed of a Group II–VI semiconductor layer, said heterojunction interface is made by Group V element surface of said first semiconductor layer and Group II element surface of said second semiconductor layer, and said two-dimensional carrier gas is generated by holes which are created by a lack of electrons, which is generated by crystal bonding between Group V elements with a valence of 5 of said Group V element surface and Group II elements with a valence of 2 of said Group II element surface in said heterojunction interface.

11. A semiconductor device according to claim 1, wherein:

said first semiconductor layer is formed of a Group II–VI semiconductor layer, said second semiconductor layer is formed of a Group IV semiconductor layer, said heterojunction interface is made by Group II element surface of said first semiconductor layer and Group IV element surface of said second semiconductor layer, and said two-dimensional carrier gas is generated by holes which are created by a lack of electrons, which is generated by crystal bonding between Group II elements with a valence of 2 of said Group II element surface and Group IV elements with a valence of 4 of said Group IV element surface in said heterojunction interface.

12. A semiconductor device according to claim 2, wherein:

concentrations of said two-dimensional electron gas are about $6 \times 10^{14}$ $cm^{-2}$; and concentrations of n-type impurities contained in said first semiconductor layer and in said second semiconductor layer are below $5 \times 10^{15}$ $cm^{-3}$, respectively.

13. A semiconductor device according to claim 1, wherein concentrations of said two-dimensional carrier gas are higher than those of impurities contained in said first semiconductor layer and said second semiconductor layer.

14. A semiconductor device comprising:

a first semiconductor layer formed of a Group III–V semiconductor layer; and a second semiconductor layer formed of a Group IV semiconductor layer which is a different material from said first semiconductor layer and formed in heterojunction with said first semiconductor layer, wherein a heterojunction interface made between a Group III element surface of said first semiconductor layer and a Group IV element surface of said second semiconductor layer is in one selected from the group consisting of a {001} plane and a {111} plane, a two-dimensional carrier gas is created by a surplus or a lack of electrons, generated by crystal bonding between elements of said first semiconductor layer and said second semiconductor layer in said heterojunction interface, said two-dimensional carrier gas generated in said heterojunction interface being a channel for a current to flow, and wherein said two-dimensional carrier gas is generated by holes created by a lack of electrons, generated by crystal bonding between Group III elements with a valence of 3 of said Group III elements surface and Group IV elements with a valence of 4 of said Group IV elements surface in said heterojunction interface, and concentrations of said two-dimensional hole gas are about $6 \times 10^{14}$ $cm^{-2}$ and concentrations of p-type impurities contained in said first semiconductor layer and in said second semiconductor layer are below $5 \times 10^{15}$ $cm^{-3}$, respectively.

15. A semiconductor device comprising:

a first semiconductor layer formed of a Group III–V semiconductor layer; and a second semiconductor layer formed of a Group IV semiconductor layer which is a different material from said first semiconductor layer and formed in heterojunction with said first semiconductor layer, wherein a heterojunction interface between a Group V element surface of said first semiconductor layer and a Group IV element surface of said second semiconductor layer is in one selected from the group consisting of {001} plane and {111} plane, a two-dimensional carrier gas is created by a surplus or a lack of electrons, generated by crystal bonding between elements of said first semiconductor layer and said second semiconductor layer in said heterojunction interface, said two-dimensional carrier gas generated in said heterojunction interface being a channel for a current to flow, and wherein said two-dimensional carrier gas is generated by electrons created by a surplus of electrons, generated by crystal bonding between Group V elements with a valence of 5 of said Group V element surface and Group IV elements with a valence of 4 of said Group IV element surface in said heterojunction interface, concentrations of said two-dimensional electron gas are about $6 \times 10^{14}$ $cm^{-2}$, and concentrations of n-type impurities contained in said first semiconductor layer and in said second semiconductor layer are below $5 \times 10^{15}$ $cm^{-3}$, respectively.

* * * * *